(12) United States Patent
Flake

(10) Patent No.: US 6,665,359 B1
(45) Date of Patent: Dec. 16, 2003

(54) DIGITAL DATA SEPARATOR

(75) Inventor: Lance Leslie Flake, Boulder, CO (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 09/429,597

(22) Filed: Oct. 28, 1999

(51) Int. Cl.[7] .............................................. H04L 7/00
(52) U.S. Cl. ....................... 375/354; 375/365; 375/355
(58) Field of Search ................................. 375/354, 365, 375/355, 359, 371, 362, 364; 340/172.5, 347; 327/141; 358/409, 424; 370/503; 704/270.1; 709/248, 400; 713/400–601; 714/12

(56) References Cited

U.S. PATENT DOCUMENTS

| | | | |
|---|---|---|---|
| 3,689,899 A | 9/1972 | Franaszek ................. 340/172.5 |
| 4,115,768 A | 9/1978 | Eggenberger et al. ...... 340/347 |
| 4,373,154 A | * | 2/1983 | Balme et al. ................. 340/347 |
| 4,796,280 A | * | 1/1989 | Nesin et al. ................. 375/110 |
| 4,808,884 A | | 2/1989 | Hull et al. ................... 375/120 |
| 5,652,773 A | * | 7/1997 | Lu ............................... 375/371 |
| 5,835,542 A | * | 11/1998 | Lu ............................... 375/359 |
| 6,175,603 B1 | * | 1/2001 | Chapman et al. ........... 375/354 |

* cited by examiner

*Primary Examiner*—Stephen Chin
*Assistant Examiner*—Sam K. Ahn
(74) *Attorney, Agent, or Firm*—Lisa K. Jorgenson; William J. Kubida

(57) ABSTRACT

A digital data separator that is capable of separating data signals and clock signals from an encoded data stream. The digital data separator includes a synchronizer to synchronize the encoded data stream with the system clock of the digital data separator. An up-counter counts the number of clock pulses between valid logic 1's in the encoded digital data stream. Combination logic compares the value of the up-counter with established threshold values to determine whether the data separator has received a valid logic 1. The combinatorial logic also reset the up-counter on determining that a valid logic 1 was received.

19 Claims, 4 Drawing Sheets

DIGITAL DATA SEPARATOR

FIELD OF THE INVENTION

The present invention relates to digital data separators and more particularly to a digital data separator for recovering digital data stored in a run length limited data stream.

BACKGROUND OF THE INVENTION

Magnetic and optical storage media, such as floppy disks and CD-ROM, store digital data in encoded formats containing both the digital data and clock information. Accordingly, the encoded digital data stream contains clock signals at regularly spaced intervals, "the clock windows," with binary data signals interspersed between successive clock signals, the "data windows." FIG. 1 shows an encoded data stream 100 having a plurality of logic 1's 102 and a plurality of logic 0's 104. In this example, encoded data stream 100 is encoded using modified frequency modulation ("MFM") to combine non-return to zero data stream 110 information with write clock stream 120 information. In the particular technique of this example, there exists a minimum of one logic 0 104 and up a maximum three logic 0's 104 between each logic 1 102 in encoded data stream 100.

As one of ordinary skill in the art recognizes, the spacing of logic 1's 102 and logic 0's 104 provide enough timing information to ensure an accurate signal recovery during a read process even in the presence of timing errors in reading or writing encoded data stream 100. Basically, timing errors exist due to disk rotational speed errors, magnetic or optical interference, electrical noise, etc. Because of these errors, reading devices need to compensate for timing deviations when extracting the encoded data and clock information.

Early techniques for separating data information from clock information in the encoded data stream used an analog phase-locked loop ("PLL"). FIG. 2 shows one possible analog PLL system 200. Analog PLL system 200 included a phase detector 202, a low-pass filter 204, and a voltage controlled oscillator ("VCO") 206. VCO 206 recovers the clock signals and supplies a recovered clock signal 208 to phase detector 202. Phase detector 202 compares signal 208 an encoded data stream input 210 to obtain phase detector output 212. Phase detector output 212 includes a low frequency error portion and a high frequency error portion. The low frequency error portion is due to the phase difference between the signal 208 and input 210. The high frequency error portion is due to bit jitter. Phase detector output 212 passes through low-pass filter 204 prior to being input into VCO 206 to attenuate the high frequency bit jitter potion. The feedback loop formed by analog PLL system 200 compensated for timing errors in the encoded data stream to ensure accurate data recovery. While accurate and functional, analog PLL system 200 is expensive and cumbersome to implement.

Eventually digital PLL systems evolved to replace analog PLL system 200. FIG. 3 shows one possible digital PLL system 300. Digital PLL system 300 includes a synchronizer 302, a phase detector 304, a digital controlled oscillator 306, a transient response and phase correction state machine 308, and a frequency tracking and correction state machine 310. Digital PLL system 300 is more fully described in U.S. Pat. No. 4,808,884 to Hull et al., entitled HIGH ORDER DIGITAL PHASE-LOCKED LOOP SYSTEM, which disclosure is incorporated herein by reference. Essentially, digital PLL system 300 compensated for timing errors in reading the encoded data stream by varying the number of registers per window between a nominal number of sixteen and a "slow" number of seventeen and a "fast" number of fifteen. Thus, the data window could be adjusted for frequency errors of ±6% from the nominal frequency. While providing a substantial improvement over analog PLLs, digital PLLs were still cumbersome.

In order to reduce the bulkiness of the analog and digital PLL systems described above, systems for separating data signals from clock signals without using PLLs were developed. FIG. 4 shows one possible digital data separator system 400. Digital data separator system 400 includes an edge detector 402, state generator 404, and an incremental counter 406. Digital data separator 400 is more fully described in U.S. Pat. No. 5,835,542 to Lu, entitled DIGITAL DATA SEPARATOR FOR SEPARATING DATA SIGNALS FROM CLOCK SIGNALS IN AN ENCODED DATA STREAM, which disclosure is incorporated herein by reference. Digital data separator 400 operates by inputting an encoded data stream edge detector 402. Upon detection of a rising edge, edge detector 402 sends a signal to state generator 404. Substantially simultaneously with the input, counter 406 begins counting clock pulses and inputs the number of counts to state generator 404. If state generator 404 receives a rising edge transition from edge detector 402 between predefined counts of counter 406, then the data information recovered is a logic 1, otherwise the data information for that data window is determined to be a logic 0. At the end of each count window (i.e. one data bit cycle), digital data separator 400 determines whether the data stream was a logic 1 or logic 0 and counter 406 is reset to begin counting for the next count window.

While digital data separator system 400 achieves its goal of reducing bulkiness of the data separator, it is limited in its ability to recognize timing errors, some of which are caused by the insertion of logic 0s in the encoded data stream by the encoding process, for example, the run length limited ("RLL") encoding process inserts one to three logic 0s between each logic 1. In particular, digital data system 400 determines whether a logic 1 or a logic 0 exists for every count window. For example, FIG. 5 shows an encoded data stream 500. Data stream 500 was encoded using a RLL encoding process. The RLL encoding process created sub-patterns 502, 504, and 506 in data stream 500. Sub-pattern 502 is a logic 0 followed by a logic 1. Sub-pattern 504 is two logic 0's followed by a logic 1. Sub-pattern 506 is three logic 0's followed by a logic 1. These sub-patterns in encoded data stream 500 cause predictable timing shifts or errors in the data information that are not accounted for by digital data separator 400 causing timing errors to propagate through the data stream and result in data recovery errors. Thus, a digital data separator that accounts for the predictable patterns and sub-patterns caused by the encoding process, for example RLL process, is desirable.

SUMMARY OF THE INVENTION

The foregoing and other features, utilities and advantages of the invention will be apparent from the following more particular description of a preferred embodiment of the invention as illustrated in the accompanying drawings, or may be learned by practice of the invention The advantages and purpose of the invention will be realized and attained by means of the elements and combinations particularly pointed out in the appended claims.

To attain the advantages and in accordance with the purpose of the invention, as embodied and broadly described herein, digital data separators consistent with the present invention separate data signals from clock signals in an encoded data stream using a synchronizer to synchronize the encoded data stream with a system clock of the digital data separator. The digital data separators further include an up-counter to count system clock pulses and combinatorial logic to produce a reset signal to reset the up-counter so that the up-counter counts pulses between valid edge detect signals. The combinatorial logic also determines whether a next edge detect signal is valid based on the count of the up-counter.

A method for digital data separation consistent with the present invention includes receiving an encoded data stream and a system clock signal at a synchronizer. The method further includes generating an edge detect signal based on the received data stream, incrementing a counter for every clock pulse and comparing a value in the counter to a plurality of thresholds based on the generated edge detect signal.

Also, a computer program product consistent with the present invention includes a computer usable medium having computer readable code embodied therein for processing encoded data. The medium further comprises: a synchronizing module configured to receive an encoded data stream and a system clock signal; an edge detecting module configured to generate an edge detect signal based on the received encoded data stream and the received system clock signal; a counting module configured to increment a counter for every clock pulse; a comparison module configured to compare a value in the counter to a plurality of thresholds based on the generated edge detect signal; and a resetting module configured to reset the counter based on the comparison from the comparison module.

BRIEF DESCRIPTION OF THE DRAWING

The accompanying drawings, which are incorporated in and constitute a part of this specification, illustrate embodiments of the present invention, and, together with the description, serve to explain the principles thereof. Like items in the drawings are referred to using the same numerical reference.

DETAILED DESCRIPTION OF THE PREFERRED EMBODIMENT

While the invention has been particularly shown and described with reference to a preferred embodiment thereof, it will be understood by those skilled in the art that various other changes in the form and details may be made without departing from the spirit and scope of the invention.

Figure 6:
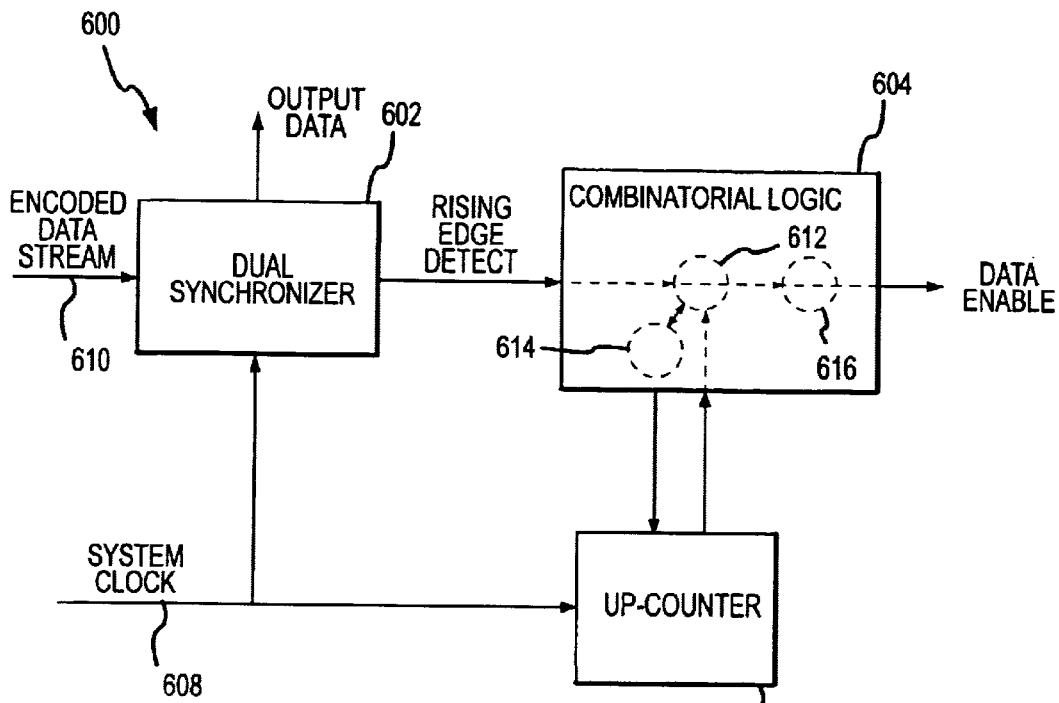
FIG. 6 is a functional block diagram of a digital data separator in accordance with the present invention.

FIG. 6 shows a digital data separator system 600 in accordance with one preferred embodiment of the present invention. Digital data separator system 600 includes a dual synchronizer 602, a combinatorial logic 604, and an up-counter 606. A system clock 608 supplies a clock frequency that is some large integer multiple of the bit rate of an encoded data stream 610. Combinatorial logic 604 includes a comparator 612, a reset signal generator 614, and a data enable signal generator 616. In the preferred embodiment shown, the system clock was set at sixteen (16) times the bit rate, although other multiples work equally well. In other words, the description that follows is based on system 600 operating with a clock that pulses sixteen times per each logic one or zero bit of encoded data stream 610.

Dual synchronizer 602 synchronizes bits from encoded data stream 610 with system clock 608. Up-counter 606 counts system clocks between logic 1's of encoded data stream 610. Combinatorial logic 604, as described in more detail below, monitors the synchronized bits from dual synchronizer 602 and filters out high frequency logic 1's. Additionally, combinatorial logic 604 qualifies logic 0's at appropriate times between logic 1's based on the encoding process and count signal supplied by up-counter 606.

Figure 7:
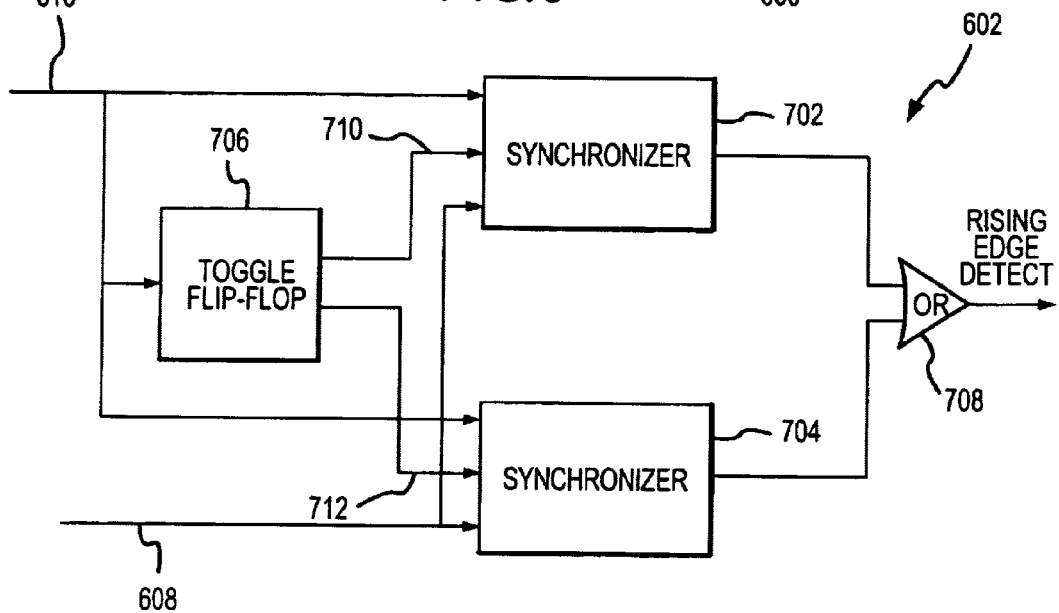
FIG. 7 is a functional block diagram of dual synchronizer 602 of FIG. 6.

FIG. 7 shows dual synchronizer 602 in more detail. Dual synchronizer 602 comprises two single synchronizers 702 and 704. A toggle flip-flop 706 outputs one of two enable signals 710 and 712 to alternatively select between synchronizers 702 and 704 such that only one synchronizer is enabled at any time. Dual synchronizer 602 also includes an OR gate 708 to form a unified edge detect signal to combinatorial logic 604 (FIG. 6). Dual synchronizer 602 also produces a data output signal.

Figure 1:
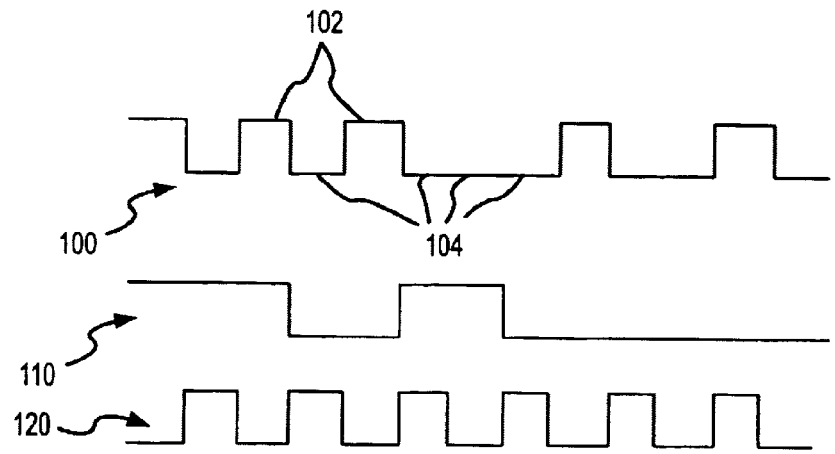
FIG. 1 is a graphical representation of a data stream, a write clock, and an encoded data stream in accordance with the present invention.
Figure 2:
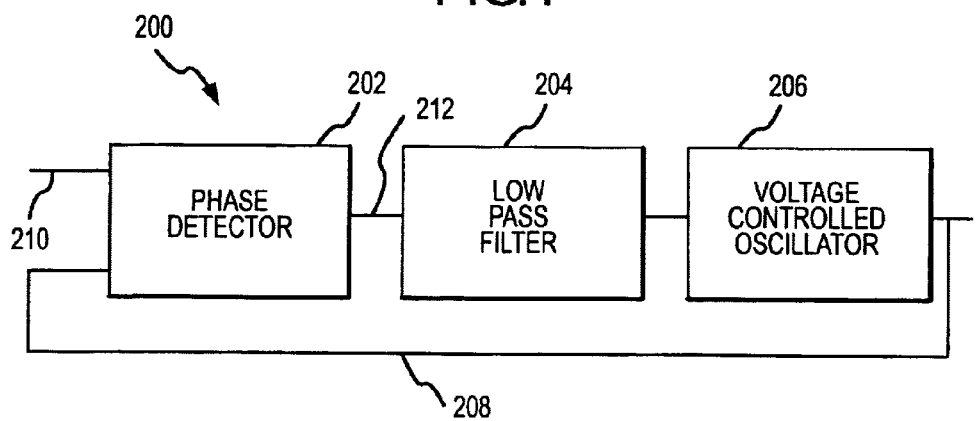
FIG. 2 is a functional block diagram of a prior art data separator.
Figure 8:
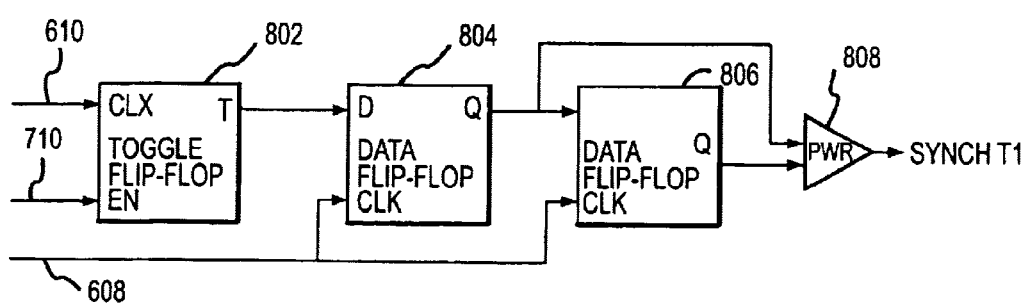
FIG. 8 is a functional block diagram of synchronizer 702 of FIG. 1.
Figure 3:
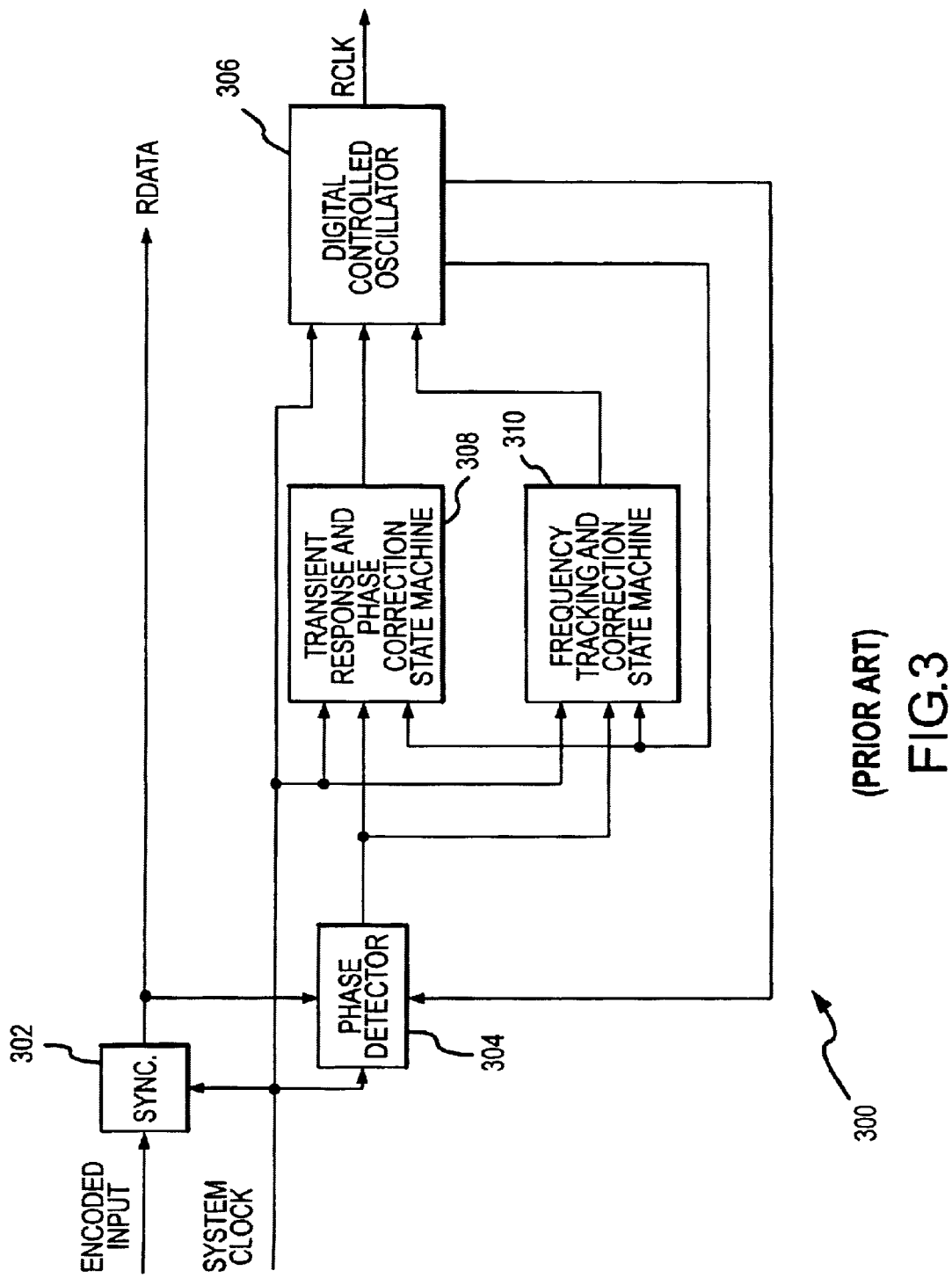
FIG. 3 is a functional block diagram of another prior art data separator.
Figure 4:
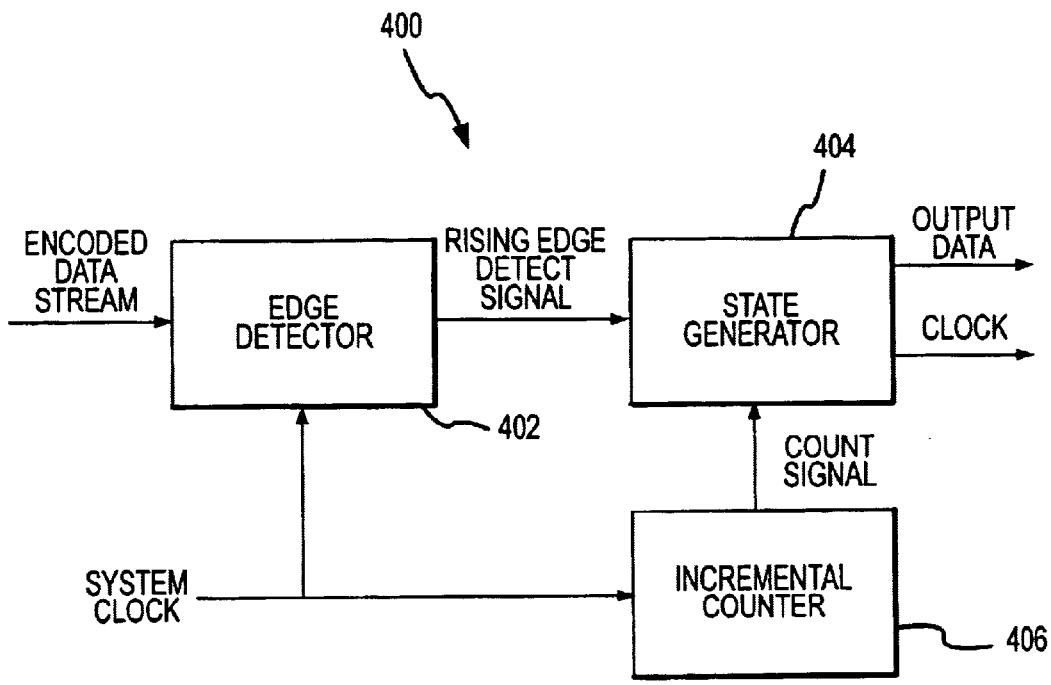
FIG. 4 is a functional block diagram of still another prior art data separator.

FIG. 8 shows synchronizer 702 in still more detail (synchronizer 702 and synchronizer 704 are identical for all intents and purposes of the present invention). Synchronizer 702 includes a toggle flip-flop 802, two data flip-flops 804 and 806, and an XOR gate 808. Toggle flip-flop 802 receives two input signals. Encoded data stream 610 is input to the clock of toggle flip-flop 802 and enable signal 710 is input to the enable of toggle flip-flop 802. When enabled, toggle flip-flop 802 captures the input rising edge of encoded data stream 610. Flip-flops 804 and 806 receive the captured rising edge of encoded data stream 610 as a high signal at their respective data inputs and receive a system clock signal at the clock. This synchronizes the output of toggle flip-flop 802 with the system clock. XOR gate 808 detects the synchronized change in value from toggle flip-flop 802 and outputs synchronized toggle signal Synch T1 that is received by OR gate 708 (FIG. 7) that outputs an edge detect signal to combinatorial logic 604. The dual synchronizer 602 allows input rising edges to be safely detected up to a rate of one per system clock pulse, where a single synchronizer would only detect rising edge up to a rate of one per two system clock pulses.

As one of ordinary skill in the art would recognize based on the above descriptions, the functions of dual synchronizer 602, combinatorial logic 604, and up-counter 606 can be implemented using circuit hardware, software or firmware, or some combination thereof. In the preferred embodiment described, for example, all functions are described using hardware such as flip-flops and logic gates.

Combinatorial logic 604 (FIG. 6) receives input from dual synchronizer 602 and up-counter 606. In operation, combinatorial logic 604 receives a rising edge signal from dual synchronizer 602 that combinatorial logic 604 determines is a valid logic 1 input. On this determination of the valid logic 1, combinatorial logic 604 causes reset signal generator 614 to generate a reset signal that clears and resets up-counter 606 to zero. Up-counter 606 starts and continues to count clock pulses until it receives the next reset signal from combinatorial logic 604. Thus, unlike the prior art separator 400 that clears the counter every data window or clock window, the present invention only clears on the determination of a valid logic 1.

Combinatorial logic 604 monitors the output of dual synchronizer 602 for the edge detect signal that could qualify as a logic 1. When Combinatorial logic 604 receives the logic 1 signal it checks the count signal supplied by up-counter 606. Based on the RLL encoding process, which has, with this example, data sub-patterns 502, 504 and 506, and the clock of digital data separator 600, which is sixteen times the frequency of the input bit rate in this example, combinatorial logic has pre-established thresholds relating to what the count signal from up-counter 606 should be when the valid logic 1 is received. Thus, combinatorial logic 604 compares the pre-established thresholds to the count signal using comparator 612. If comparator 612 determines that combinatorial logic 604 received the logic 1 before the minimum threshold, the logic 1 is discarded as a high frequency error. If comparator 612 determines that combinatorial logic 604 received the logic 1 within the established thresholds, then the logic 1 is determined valid and reset signal generator 614 generates the reset signal to clear up-counter 606, and the process begins again. For the MFM code and a clock of sixteen times the input data rate the minimum threshold would be 8.

Figure 5:
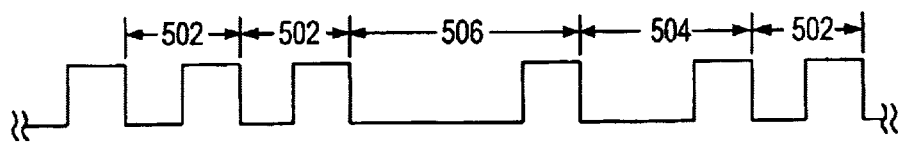
FIG. 5 is a graphical representation of an encoded data stream having sub-patterns.

For a clock of sixteen times the input data rate and sub-patterns 502, 504 and 506, combinatorial logic 604 thresholds could be, in a perfect system, 32 counts for patterns 502, 48 counts for pattern 504, and 64 counts for pattern 506. However, because the system is not perfect, combinatorial logic 604 has established thresholds. For the example of a system clock of 16 times the bit rate, simple threshold values would be 23, 39, 55, and others in this sequence as needed to process the particular RLL code. For the MFM code comprising sub-patterns 502, 504 and 506 these three threshold values would be used. The zero data bit thresholds represent the ending time where a particular sub-sequence ends, with the next counter value representing the beginning of the next sub-sequence. For this particular example of the preferred embodiment, a counter value of 23 represents the end of a sub-pattern 502 (FIG. 5), etc. Thus, when combinatorial logic 604 determines that a logic 1 was received it uses the count signal to insert the proper number of logic 0's into the data stream. For example, if the logic 1 was received at 32 counts, then the sub-pattern was sub-pattern 502, or a logic 0 followed by a logic 1. If, however; the logic 1 was received at 64 counts, then the sub-pattern is sub-pattern 506, or three logic 0's followed by a logic 1.

Other zero data bit thresholds could be used to allow for predictable timing errors found in sequences of sub-patterns due to magnetic interference. Also, if the thresholds are presented to the combinatorial logic 604 as additional input signals then they may be modified dynamically to try data recovery with different thresholds. This capability is useful during a retry sequence if the original thresholds produced errors in the recovered data stream because of too much noise in the input data stream. Other zero data bit thresholds could be used for other system clock to input data stream frequency ratios. Other thresholds could be used for other RLL encoding schemes.

I claim:

1. A method for separating data signals from clock signals in an encoded data stream, comprising:

receiving an encoded data stream and a system clock signal at a synchronizer wherein the synchronizer includes two single synchronizers each capable of receiving one of two enable signals so that one of the two single synchronizers is enabled;

generating an edge detect signal based on the received encoded data stream and the received system clock signal;

incrementing an up-counter for every system clock pulse;

comparing a value in the counter to a threshold based on the generated edge detect signal, wherein the comparing includes determining whether the generated edge detect signal is valid based on the threshold; and when the comparing indicates the generated edge detect signal is valid, resetting the counter based on the comparison.

2. The method according to claim 1, wherein the receiving step further comprises enabling the synchronizer.

3. The according to claim 1, wherein the generating step further comprises capturing a rising edge of the encoded data stream.

4. A computer program product comprising:

a computer usable medium having computer readable code embodied therein for processing encoded data, the computer usable medium comprising:

a synchronizing module configured to received an encoded data stream and a system clock signal, including two single synchronizers each capable of receiving one of two enable signals so that one of the two single synchronizers is enabled;

an edge detecting module configured to generate an edge detect signal based on the received encoded data stream and the received system clock signal;

an up-counting module configured to increment a counter for every system clock pulse;

a comparison module configured to compare a value in the counter to a plurality of thresholds based on the generated edge detect signal; and a resetting module configured to reset the counter based on the comparison.

5. The computer program product according to claim 4, further comprising an enabling module configured to enable the synchronizer module.

6. The computer program product according to claim 4, wherein the edge detect module is further configured to capture a rising edge of the encoded data stream.

7. The computer program product according to claim 4, wherein the comparison module is further configured to determine whether the generated edge detect signal is valid.

8. The computer program product according to claim 7, wherein the resetting module is configured to only reset the up-counting module on a valid determination.

9. A disk drive system, comprising:

a disk drive adapted to receive media, the media having data stored thereon;

a read head coupled to disk drive capable of reading data from the media and generating an encoded data stream;

a synchronizer for synchronizing the encoded data stream with a system clock and generating a next edge detect signal including a first toggle flip-flop that generates at least two enable signals, at least two single synchronizers each capable of receiving one of the at least two enable signals so that one of the at least two single synchronizers is enabled, and an OR gate coupled to outputs of the at least two single synchronizers for generating the valid edge detect and next edge detect signals;

an up-counter for counting the system clock pulses and outputting a count signal, wherein the up-counter is reset in response to a reset signal; and combinatorial logic producing the reset signal to reset the up-counter upon receiving the next edge detect signal and determining whether the next edge detect signal is valid based on the count signal, whereby the combinatorial logic outputs a data enable signal for each valid determination.

10. The disk drive system according to claim 9, wherein each of the at least two single synchronizers further comprise:

a first data flip-flop for receiving the encoded data stream and receiving one of the at least two enable signals from the first toggle flip-flop, so that the second toggle flip-flop captures a rising edge of the encoded data stream;

a second data flip-flop that receives the system clock at a clock input and the captured rising edge of the encoded data stream at a data input and outputs the captured rising edge of the encoded data stream to a XOR gate; and a third data flip-flop that receives the system clock at a clock input and the captured rising edge of the encoded data stream from the first data flip-flop at a data input and outputting the captured rising edge of the encoded data stream from the first and second data flip-flops and outputting valid and next edge detect signals.

11. The disk drive system according to claim 9 wherein the combinatorial logic further comprises:

a comparator for comparing the count signal with a plurality of thresholds on reception of the next edge detect signal;

a reset signal generator to generate a reset signal that resets the up-counter based on the comparison; and a data enable signal generator to generate a data enable signal based of the comparison.

12. The disk drive system according to claim 9 wherein the up-counter receives the reset signal only from the combinatorial logic.

13. A digital data separator for separating data signals from clock signals in an encoded data stream, comprising;

a synchronizer for synchronizing the encoded data stream with a system clock and generating a next edge detect signal, wherein the synchronizer includes two single synchronizers each capable of receiving one of two enable signals so that one of the two single synchronizers is enabled;

an up-counter for counting the system clock pulses and outputting a count signal, wherein the up-counter is reset in response to a reset signal; and combinatorial logic producing the reset signal to reset the up-counter upon receiving the next edge detect signal and determining whether the next edge detect signal is valid based on the count signal, whereby the combinatorial logic outputs a data enable signal for each valid determination.

14. The digital data separator according to claim 13, wherein the synchronizer further comprises:

a first toggle flip flop that generates the two enable signals; and an OR gate coupled to outputs of the two single synchronizers generating the next edge detect signal.

15. The digital data separator according to claim 14, wherein each of the at least two single synchronizers further comprise:

a second toggle flip-flop for receiving the encoded data stream and receiving one of the at least two enable signals from the first toggle flip-flop, so that the second toggle flip-flop captures a rising edge of the encoded data stream;

a first data flip-flop that receives the system clock at a clock input and the captured rising edge of the encoded data stream at a data input and outputs the captured rising edge of the encoded data stream to a XOR gate and to a second data flip-flop; and the second data flip-flop that receives the system clock at a clock input and the captured rising edge of the encoded data stream from the first data flip-flop at a data input and outputting the captured rising edge of the encoded data stream to the XOR gate; and the XOR gate for receiving the captured rising edge of the encoded data stream from the first and second data flip-flops and outputting valid and next edge detect signals.

16. The digital data separator according to claim 13 wherein the combinatorial logic further comprises:

a comparator for comparing the count signal with a plurality of thresholds on reception of the next edge detect signal;

a reset signal generator to generate a reset signal that resets the up-counted based on the comparison; and a data enable signal generator to generate a data enable signal based on the comparison.

17. The digital data separator according to claim 13 wherein the up-counter receives the reset signal only from the combinatorial logic.

18. The digital data separator according to claim 13 wherein the system clock is a multiple of a data rate.

19. The digital data separator according to claim 18 wherein the system dock is sixteen times the data rate.

* * * * *